US012346308B2

(12) United States Patent
Huang et al.

(10) Patent No.: US 12,346,308 B2
(45) Date of Patent: Jul. 1, 2025

(54) DATA COMPRESSION METHOD AND APPARATUS

(71) Applicant: Huawei Technologies Co., Ltd., Shenzhen (CN)

(72) Inventors: Jianmin Huang, Dongguan (CN); Chao Song, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/606,769

(22) Filed: Mar. 15, 2024

(65) Prior Publication Data

US 2024/0248891 A1 Jul. 25, 2024

Related U.S. Application Data

(63) Continuation of application No. PCT/CN2022/097436, filed on Jun. 7, 2022.

(30) Foreign Application Priority Data

Sep. 15, 2021 (CN) .......................... 202111083020.6

(51) Int. Cl.
*G06F 16/23* (2019.01)
(52) U.S. Cl.
CPC .................. *G06F 16/2365* (2019.01)
(58) Field of Classification Search
CPC ................................ G06F 16/2365
USPC ....................................... 707/693
See application file for complete search history.

(56) References Cited

U.S. PATENT DOCUMENTS

| 10,103,747 | B1* | 10/2018 | Pasha.B.K. ............. H03M 7/30 |
| 2019/0312587 | A1* | 10/2019 | Sofia ................. G06F 15/17325 |
| 2019/0393889 | A1* | 12/2019 | Sofia ................... H03M 7/6076 |
| 2020/0067523 | A1* | 2/2020 | Sofia ................... H03M 7/3086 |

FOREIGN PATENT DOCUMENTS

| CN | 102761339 A | 10/2012 |
| CN | 106936441 A | 7/2017 |
| CN | 108141471 A | 6/2018 |
| CN | 116707536 A | 9/2023 |

OTHER PUBLICATIONS

Andrei Hagiescu et al:"Accelerate Compression on intel FPGAs." Jan. 28, 2020, total 8 pages.
Dingwentao:"GPU-lossless-compression." GitHub, Oct. 31, 2019, total 7 pages.

* cited by examiner

*Primary Examiner* — Robert W Beausoliel, Jr.
*Assistant Examiner* — Lauren Zannah Ganger
(74) *Attorney, Agent, or Firm* — Conley Rose. P.C.

(57) ABSTRACT

A compression system includes at least one acceleration device, a memory of the acceleration device stores a compression library, and the compression library includes one or more compression algorithms that support implementation of a lossless compression mode. The lossless compression mode is split into one or more fine-grained compression algorithms. Therefore, when obtaining any compression request, the compression system may select, based on an identifier that is carried in the compression request and that indicates a lossless compression mode, a compression algorithm corresponding to the lossless compression mode, thereby performing compression processing on data in the specified lossless compression mode by using the compression algorithm corresponding to the identifier.

20 Claims, 5 Drawing Sheets

DATA COMPRESSION METHOD AND APPARATUS

CROSS-REFERENCE TO RELATED APPLICATIONS

This is a continuation of International Patent Application No. PCT/CN2022/097436 filed on Jun. 7, 2022, which claims priority to Chinese Patent Application No. 202111083020.6 filed on Sep. 15, 2021. The disclosures of the aforementioned applications are hereby incorporated by reference in their entireties.

TECHNICAL FIELD

This application relates to the field of data compression, and in particular, to a data compression method and apparatus.

BACKGROUND

With the development of big data, artificial intelligence (AI), and cloud computing technologies, a large amount of data is continuously generated. To reduce storage requirements of the large amount of data, many data compression modes emerge, such as lossy compression algorithms and lossless compression algorithms. A lossless compression algorithm is used as an example. A compression device performs a compression operation on any non-random file through the lossless compression algorithm by using an acceleration device, to generate a compressed file, where the compressed file may be completely restored by performing a decompression operation. The acceleration device is a device including a dedicated processor that supports implementation of the lossless compression algorithm. One acceleration device can support implementation of only one lossless compression algorithm. As a result, the acceleration device cannot adapt to other lossless compression algorithms. Therefore, how to provide a more effective data compression method becomes an urgent problem to be resolved currently.

SUMMARY

This application provides a data compression method and apparatus, to resolve a problem that one acceleration device can implement only one lossless compression mode.

According to a first aspect, this application provides a data compression method. The method is applied to a compression system, or a physical device that supports the compression system in implementing the data compression method. For example, the physical device includes a chip system. The compression system includes at least one acceleration device. The data compression method includes: First, the compression system obtains a first request, where the first request carries first data of a first application and a first identifier indicating a first lossless compression mode. Then, the compression system selects, based on the first request, a compression algorithm that matches the first identifier from a compression library, where the compression library includes at least one compression algorithm supporting implementation of the first lossless compression mode, and the compression library is stored in a memory of the acceleration device. Finally, the compression system performs compression processing on the first data based on the compression algorithm that matches the first identifier, to obtain second data.

In this way, the lossless compression mode is split into one or more fine-grained compression algorithms, the memory of the acceleration device stores the compression library, and the compression library includes one or more compression algorithms that support implementation of a lossless compression mode. Therefore, when obtaining any compression request, the compression system may select, based on an identifier that is carried in the compression request and that indicates a lossless compression mode, a compression algorithm corresponding to the lossless compression mode, thereby performing compression processing on data in the specified lossless compression mode by using the compression algorithm corresponding to the identifier, to avoid a problem that one acceleration device can implement only one lossless compression mode in common technologies, and improve lossless compression adaptability of the acceleration device in the compression system.

In an optional implementation, the compression algorithm included in the compression library includes any one or a combination of the following: a Lempel-Ziv (Lz) 77 compression algorithm, a Huffman coding algorithm, a cyclic redundancy check (CRC) algorithm, a finite state entropy (FSE) algorithm, and compression state maintenance. In a possible specific example, the CRC algorithm may be a CRC32 algorithm. The CRC32 algorithm is to generate a 4-byte (32-bit) check value, and perform data check by using an 8-bit hexadecimal number, for example, FA 12 CD 45. The CRC algorithm has advantages of being simple and fast. That is to say, the compression library may include one or more fine-grained compression algorithms that support implementation of a lossless compression mode, so that one acceleration device may combine a plurality of fine-grained compression algorithms, thereby implementing a plurality of lossless compression modes and compressing data, to avoid a problem that one acceleration device can implement only one lossless compression mode in common technologies, and effectively improve data compression performance of the compression system.

In another optional implementation, the data compression method further includes: A scheduling device included in the compression system obtains, for each of compression algorithms that match the first identifier, an adaptation relationship between the compression algorithm and the first lossless compression mode; and processes the second data based on the adaptation relationship corresponding to the compression algorithm that matches the first identifier, to obtain third data. The third data satisfies a compression requirement of the first lossless compression mode. When the compression library of the acceleration device does not include the compression algorithm required by the lossless compression mode, if the compression algorithm required by the lossless compression mode may be implemented by another compression algorithm in the compression library, the scheduling device included in the compression system may adapt the another compression algorithm to the lossless compression mode. Specifically, the scheduling device adapts the another compression algorithm to the compression algorithm required by the lossless compression mode, so that the scheduling device processes the compressed second data by using an adaptation relationship corresponding to the another compression algorithm, to obtain the third data that satisfies the compression requirement of the specified lossless compression mode.

In another optional implementation, that the compression system performs compression processing on the first data, to obtain second data includes: First, the scheduling device included in the compression system sends, to a first acceleration device included in the at least one acceleration device, the first data and an indication for loading the compression algorithm that matches the first identifier to perform compression. Second, the first acceleration device compresses the first data by using the compression algorithm that matches the first identifier, to obtain the second data. In this way, when the compression system includes a plurality of different acceleration devices, the scheduling device included in the compression system may select a matched acceleration device based on information such as working statuses and data transmission and processing capabilities of the different acceleration devices, and the selected acceleration device performs a data compression operation, to avoid a case that compression processing is performed on to-be-compressed data in the compression system by an acceleration device that runs another compression or decompression process, thereby reducing a waiting time required for data compression, and improving data compression efficiency of the compression system.

In another optional implementation, before the scheduling device sends the first data to the first acceleration device, that the compression system performs compression processing on the first data to obtain second data further includes: The scheduling device obtains a status of each acceleration device of the at least one acceleration device; and selects, as the first acceleration device, an acceleration device in an idle state that is in the at least one acceleration device and that supports implementation of the compression algorithm that matches the first identifier. Because the scheduling device included in the compression system may schedule an acceleration device based on information such as working statuses of a plurality of acceleration devices, when the compression system includes a plurality of acceleration devices, load balancing management of the plurality of acceleration devices in the compression system can be effectively implemented, thereby improving overall efficiency of performing data compression or decompression by the compression system.

In another optional implementation, the data compression method further includes: First, the scheduling device obtains a second request, where the second request carries fourth data of a second application and a second identifier indicating a second lossless compression mode. Then, the scheduling device selects, based on the second request, a compression algorithm that matches the second identifier from the compression library. In addition, the scheduling device selects a second acceleration device that is in the compression system and that supports implementation of the compression algorithm that matches the second identifier. Finally, the second acceleration device compresses the fourth data by using the compression algorithm that matches the second identifier, to obtain fifth data. Data provided by different applications may be implemented by different acceleration devices in the compression system, to avoid data confusion caused by compressing the data provided by the different applications by one acceleration device and avoid an excessively long data processing time caused by excessively heavy data compression or decompression load of the one acceleration device, thereby reducing a total time consumed by the compression system to perform data compression or decompression on data provided by a plurality of applications, and improving data compression or decompression efficiency of the compression system.

In another optional implementation, the first lossless compression mode is any one of the following: function compression (zlib compression), Snappy compression, and Zstandard (Zstd) compression that provide data compression and decompression modes. In this way, one acceleration device in the compression system may select a corresponding compression algorithm from the compression library, to implement a plurality of lossless compression modes, such as the foregoing zlib compression, Snappy compression, and Zstd compression, to resolve a problem that one acceleration device can implement only one lossless compression mode in common technologies, improve compression performance of the acceleration device, and further improve data compression efficiency of the compression system.

In another optional implementation, the scheduling device is a server, and the acceleration device is an accelerator card. In this case, the compression system is a system including a server and one or more accelerator cards. The accelerator card may be integrated into the server, or may be externally connected to an external interface provided by the server.

In another optional implementation, the scheduling device is a virtual machine (VM) or a container, and the acceleration device is a virtual accelerator card. In an example, the scheduling device and the acceleration device run on a same physical device, for example, a server. In another example, the scheduling device and the acceleration device run on different physical devices. For example, the scheduling device runs in a hardware environment provided by a server, and the acceleration device runs in a hardware environment provided by a physical accelerator card. The physical accelerator card has a software layer. The software layer may virtualize computing resources, storage resources, network resources, and the like of the physical accelerator card. One physical accelerator card may be virtualized into a plurality of virtual accelerator cards, and one virtual accelerator card may use at least some resources of the physical accelerator card.

According to a second aspect, this application provides a data compression method. The method is applied to a compression system, or a physical device that supports the compression system in implementing the data compression method. For example, the physical device includes a chip system. The compression system includes a scheduling device and at least one acceleration device. The data compression method includes: First, the scheduling device obtains a first request, where the first request carries first data of a first application and a first identifier indicating a first lossless compression mode. Then, the scheduling device selects, based on the first request, a compression algorithm that matches the first identifier from a compression library, where the compression library includes at least one compression algorithm supporting implementation of the first lossless compression mode, and the compression library is stored in a memory of the acceleration device. Finally, the acceleration device performs compression processing on the first data based on the compression algorithm that matches the first identifier, to obtain second data.

It should be noted that the compression system in the second aspect may further implement the method in any implementation of the first aspect. For advantageous effects, refer to descriptions in any implementation of the first aspect. Details are not described herein again.

According to a third aspect, this application provides a data compression apparatus. The data compression apparatus is used in a compression system, the compression system includes at least one acceleration device, and the data compression apparatus includes modules configured to perform the data compression method in the first aspect or any possible implementation of the first aspect.

For advantageous effects, refer to descriptions of any implementation of the first aspect, and details are not described herein again. The data compression apparatus has a function of implementing behaviors in the method example in any implementation of the first aspect. The function may be implemented by using hardware, or may be implemented by hardware executing corresponding software. The hardware or software includes one or more modules corresponding to the foregoing function.

According to a fourth aspect, this application provides a compression system. The compression system includes a scheduling device and at least one acceleration device. The scheduling device is configured to obtain a first request, where the first request carries first data of a first application and a first identifier indicating a first lossless compression mode. The scheduling device is configured to select, based on the first request, a compression algorithm that matches the first identifier from a compression library. The compression library includes at least one compression algorithm supporting implementation of the first lossless compression mode, and the compression library is stored in a memory of the acceleration device. The acceleration device is configured to perform compression processing on the first data based on the compression algorithm that matches the first identifier, to obtain second data. For advantageous effects, refer to descriptions of any implementation of the first aspect, and details are not described herein again.

According to a fifth aspect, this application provides a scheduling device. For advantageous effects, refer to descriptions of any implementation of the first aspect, and details are not described herein again. The scheduling device includes: one or more interfaces, configured to receive a first request, where the first request carries first data of a first application and a first identifier indicating a first lossless compression mode; and a processor, configured to select, based on the first request, a compression algorithm that matches the first identifier from a compression library, where the compression library includes at least one compression algorithm supporting implementation of the first lossless compression mode, and the compression library is stored in a memory of the acceleration device. The one or more interfaces are further configured to indicate the acceleration device included in a compression system to perform compression processing on the first data based on the compression algorithm that matches the first identifier, to obtain second data.

In addition, the processor may be further configured to implement the method in the first aspect and any possible implementation of the first aspect by using a logic circuit or executing a code instruction.

According to a sixth aspect, this application provides an acceleration device. For advantageous effects, refer to descriptions of any implementation of the first aspect, and details are not described herein again. The acceleration device includes: one or more interfaces, configured to receive first data and an indication for loading a compression algorithm that matches a first identifier to perform compression that are sent by a scheduling device; and a processor, configured to schedule the compression algorithm that matches the first identifier to compress the first data, to obtain second data. For example, the acceleration device includes a VM configured to implement data compression acceleration, storage space of the acceleration device includes a compression library, and the compression library supports implementation of a plurality of compression algorithms.

In addition, the processor may be further configured to implement the method in the first aspect and any possible implementation of the first aspect by using a logic circuit or executing a code instruction.

According to a seventh aspect, this application provides a computer-readable storage medium. The storage medium stores a computer program or an instruction. When the computer program or the instruction is executed by a compression system or a processor, the method in the first aspect and any possible implementation of the first aspect is implemented.

According to an eighth aspect, this application provides a computer program product. The computer program product includes an instruction, and when the computer program product runs on a compression system or a processor, a server or the processor is enabled to execute the instruction, to implement the method in the first aspect and any possible implementation of the first aspect.

According to a ninth aspect, this application provides a chip, including a memory and a processor. The memory is configured to store a computer instruction, and the processor is configured to invoke the computer instruction from the memory and run the computer instruction, to perform the method in the first aspect and any possible implementation of the first aspect.

In this application, the implementations according to the foregoing aspects may be further combined to provide more implementations.

DESCRIPTION OF EMBODIMENTS

For a clear and concise description of the following embodiments, basic technologies are briefly described first.

Figure 1:
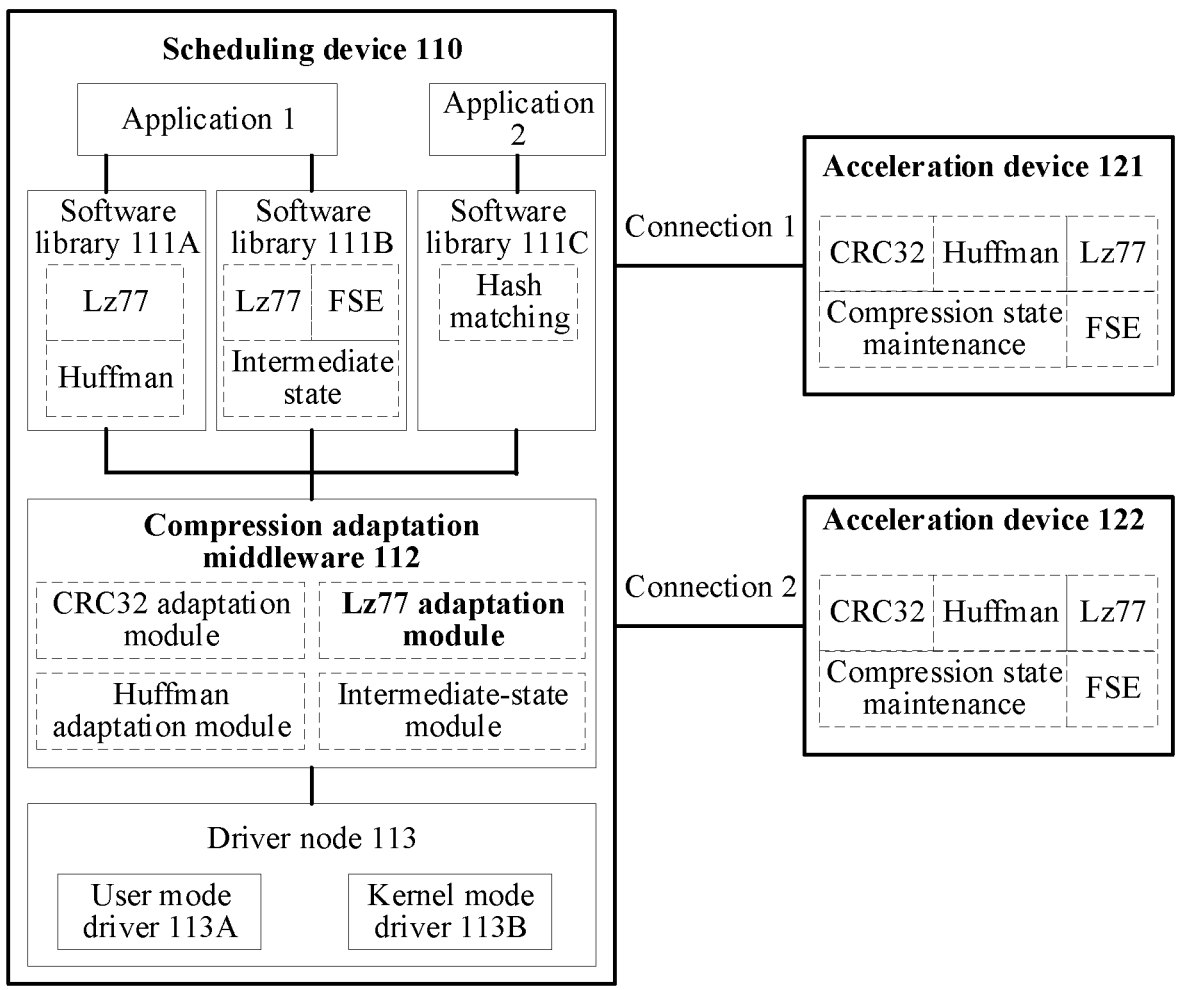
FIG. 1 is a schematic diagram of a structure of a compression system according to this application.

FIG. 1 is a schematic diagram of a structure of a compression system according to this application. The compression system includes a scheduling device 110 and at least one acceleration device (an acceleration device 121 and an acceleration device 122 shown in FIG. 1).

In a first possible example, the scheduling device 110 may be a server, for example, an application server that supports a compression service. The application server may provide a compression service for data such as videos, images, or text, or a resource scheduling function for a data compression service.

For example, when the scheduling device 110 is a server, the scheduling device 110 may include one processor and one or more interfaces.

The processor is configured to determine a scheduling policy of the scheduling device 110. The processor may include one or more processor cores (core). The processor may be an ultra-large-scale integrated circuit. An operating system and another software program are installed in the processor, so that the processor can implement access to a memory and various Peripheral Component Interconnect Express (PCIe) devices. It may be understood that in embodiments, the core in the processor may be a central processing unit (CPU), or may be another application-specific integrated circuit (ASIC). The processor may alternatively be a general-purpose processor, a digital signal processor (DSP), an ASIC, a field-programmable gate array (FPGA), a graphics processing unit (GPU), an AI chip, a system-on-a-chip (SoC) or another programmable logic device, a discrete gate, a transistor logic device, or a discrete hardware component. In actual application, the scheduling device 110 may alternatively include a plurality of processors.

The one or more interfaces included in the scheduling device 110 are configured to receive data from a peripheral, or send data, an instruction, and the like to the acceleration device.

In a second possible example, the scheduling device 110 may alternatively be a data center, and the data center may include one or more physical devices having a compression processing function, such as a server, a mobile phone, a tablet computer, or another device.

In a third possible example, the scheduling device 110 may alternatively be a server cluster in which a plurality of servers is deployed. The server cluster may have a rack, and the rack may establish communication for the plurality of servers through a wired connection, for example, a Universal Serial Bus (USB) or a PCIe high-speed bus.

The acceleration device is a hardware device including a processor, for example, the acceleration device 121 and the acceleration device 122 shown in FIG. 1. The processor may be a CPU, an ASIC, another general-purpose processor, a DSP, an ASIC, an FPGA, another programmable logical device, a discrete gate or transistor logic device, a discrete hardware component, or the like. In some cases, the processor included in the acceleration device may alternatively be a neural processing unit (NPU), a GPU, or the like. A specific form, a quantity, and the like of acceleration devices are not limited in this application.

In a possible case, the scheduling device 110 and the acceleration device are disposed in a same physical device. In other words, when the scheduling device 110 and the acceleration device are disposed in a same physical device, the compression system is the physical device. For example, the physical device is a server, and the scheduling device 110 and the acceleration device are connected via a USB, a PCIe, or the like. As shown in FIG. 1, a connection (manner) 1 used between the scheduling device 110 and the acceleration device 121 is PCIe. When the acceleration device accesses the scheduling device 110 using PCIe, the acceleration device may also be referred to as an accelerator card.

In another possible case, the scheduling device 110 and the acceleration device are disposed in different physical devices. In other words, when the scheduling device 110 and the acceleration device are disposed in different physical devices, the compression system is a system including a plurality of physical devices. For example, the scheduling device 110 is a server, and the acceleration device is a processing device externally connected to the server. The scheduling device 110 and the acceleration device may be wirelessly connected by using a network such as the Internet, and the scheduling device 110 and the acceleration device may alternatively be wiredly connected by using an Ethernet. As shown in FIG. 1, a connection (manner) 2 used between the scheduling device 110 and the acceleration device 122 is an Ethernet.

It should be noted that the foregoing example is merely a possible implementation of the scheduling device 110 and the acceleration device provided in embodiments. A quantity and a type of devices included in the compression system are not limited in embodiments of this application.

In some optional implementations, the scheduling device 110 is a VM or a container in a cloud computing scenario, and the acceleration device is a virtual accelerator card. For example, the scheduling device 110 may manage a plurality of nodes, and schedule a VM for data compression acceleration. The virtual accelerator card may be obtained by virtualizing a physical accelerator card. For example, one physical accelerator card may be virtualized into a plurality of virtual accelerator cards, and the plurality of virtual accelerator cards may all use storage resources, computing resources, network resources, and the like of the physical accelerator card.

Still referring to FIG. 1, a plurality of applications (APP) such as an application 1 and an application 2 shown in FIG. 1 are run in the scheduling device 110. These applications may be, but are not limited to a big data application, an AI application, a cloud computing application, or the like.

The scheduling device 110 is configured to support implementation of a plurality of lossless compression modes. Technologies used in these lossless compression modes include entropy encoding, run-length encoding, dictionary compression, and the like. The compression system can use these technologies and other technologies to enable an 8-bit character or string to be represented by a small number of bits, thereby removing a large amount of duplicate data.

In an actual lossless compression process, implementation of these lossless compression modes is supported by a standard lossless compression software library. As shown in FIG. 1, a software library 111A is a zlib compression software library, a software library 111B is a Snappy compression software library, and a software library 111C is a Zstd compression software library. In addition, the scheduling device 110 further supports implementation of another standard lossless compression mode. For example, the scheduling device 110 may further invoke a standard interface provided by an Lz4 compression software library, to implement an Lz4 lossless compression mode. The foregoing lossless compression modes and lossless compression software libraries are merely examples provided in embodiments, and should not be construed as any limitation on this application.

Compression adaptation middleware 112 and a driver node 113 are deployed in the scheduling device 110.

The compression adaptation middleware 112 refers to a VM or a container, and the VM or the container refers to a software process configured to implement adaptation between a compression algorithm and a lossless compression mode. When the compression adaptation middleware 112 is a VM or a container, the compression adaptation middleware 112 may be deployed in the foregoing scheduling device 110. This is not limited in this application. In a possible specific example, program code corresponding to the compression adaptation middleware 112 may be integrated into a specified processing unit (or processing core) in the processor of the scheduling device 110.

The compression adaptation middleware 112 includes a plurality of compression algorithm adaptation modules.

These adaptation modules may implement functions of adaptation and conversion between compression algorithms and lossless compression modes. The compression adaptation middleware 112 converts and adapts compression algorithms as required based on support for different compression algorithms.

For example, an Lz77 adaptation module shown in FIG. 1 may convert a hash matching algorithm that supports implementation of the Snappy lossless compression mode into an Lz77 algorithm, and implement hardware acceleration through a function component invoking interface.

In another example, an intermediate-state adaptation module shown in FIG. 1 may implement state maintenance in a lossless compression process, so as to ensure compression state maintenance in a data stream compression process.

As shown in FIG. 1, the compression adaptation middleware 112 may alternatively include a CRC32 adaptation module, a Huffman adaptation module, and the like. It should be noted that FIG. 1 shows only an example of some adaptation modules, and the compression adaptation middleware 112 may further include adaptation modules of other compression algorithms, such as an FSE adaptation module.

Because access capabilities between different programs may need to be limited to prevent these programs from obtaining memory data of another program or obtaining data of a peripheral, the scheduling device 110 performs division to obtain two permission levels: a user mode and a kernel mode. As shown in FIG. 1, the driver node 113 is a data driver, the data driver is configured to manage at least one or more acceleration devices, and the driver node 113 includes a user mode driver 113A and a kernel mode driver 113B.

When a task or a process invokes the compression system and is executed in a kernel code, the process is in the kernel mode. In this case, the processor runs in the kernel code with a highest privilege level. In the kernel mode, the processor may access all data in the memory, including data of peripherals such as a hard disk and a network adapter, and the processor may alternatively switch itself from one program to another program. When a process is executing code of a user, the process is in the user mode. In this case, the processor runs in the user code with a lowest privilege level, and can use only a conventional processor instruction set, but cannot use a processor instruction set for operating a hardware resource. In the user mode, the processor can only access the memory with restrictions, and is not allowed to access peripherals, such as I/O read/write, network adapter access, and memory application. In addition, resources of the processor can be obtained by other programs.

Generally, an application program is run in the user mode. However, sometimes the application program also needs to perform some operations in the kernel mode, for example, reading data from a hard disk or obtaining input by using a keyboard. Only the operating system can perform the operations. Therefore, in this case, the program needs to switch from the user mode to the kernel mode. There are three manners of switching from the user mode to the kernel mode.

Manner A. System call: A system call is a manner in which a process in the user mode actively requests to switch to the kernel mode. The process in the user mode applies for using a service program of the operating system through the system call to complete work.

Manner B. Exception: When the CPU executes a program run in the user mode, some previously unknown exceptions occur. In this case, the current running process is triggered to switch to a kernel-related program that processes the exceptions, that is, switch to the kernel mode, for example, a page fault exception.

Manner C. Peripheral interrupt: After completing an operation requested by a user, a peripheral sends a corresponding interrupt signal to the CPU. In this case, the CPU pauses executing a next to-be-executed instruction and executes a processing program corresponding to the interrupt signal. If a previously executed instruction is a program in the user mode, the conversion process naturally switches from the user mode to the kernel mode. For example, after read/write operations on the hard disk are completed, the system switches to an interrupt processing program for the read/write on the hard disk to perform subsequent operations. The three manners are the most important manners for the system to switch from the user mode to the kernel mode during running. The system call can be regarded as being initiated actively by the process of the user, and the exception and the peripheral interrupt are passive.

The acceleration device may invoke a plurality of compression algorithms to compress or decompress data. The acceleration device 121 shown in FIG. 1 is used as an example for description. The foregoing compression algorithms include but are not limited to: a CRC32 algorithm, a Huffman coding algorithm, an Lz77 compression algorithm, an FSE compression algorithm, compression state maintenance, and the like. For specific content of these compression algorithms, refer to subsequent descriptions in this specification. Details are not described herein again.

The application 1 may invoke a lossless compression mode corresponding to the software library 111A and the software library 111B to perform data compression, and the application 2 may invoke a lossless compression mode corresponding to the software library 111C to perform data compression. In addition, FIG. 1 is merely an example. The application 1 and the application 2 may further invoke another lossless compression mode to perform data compression. For example, the application 1 may invoke a lossless compression mode corresponding to the software library 111C to perform data compression. A lossless compression mode invoked by an application is related to a data compression requirement of a service in the application. This is not limited in this application.

The following describes implementations of embodiments of this application in detail with reference to the accompanying drawings.

Figure 2:
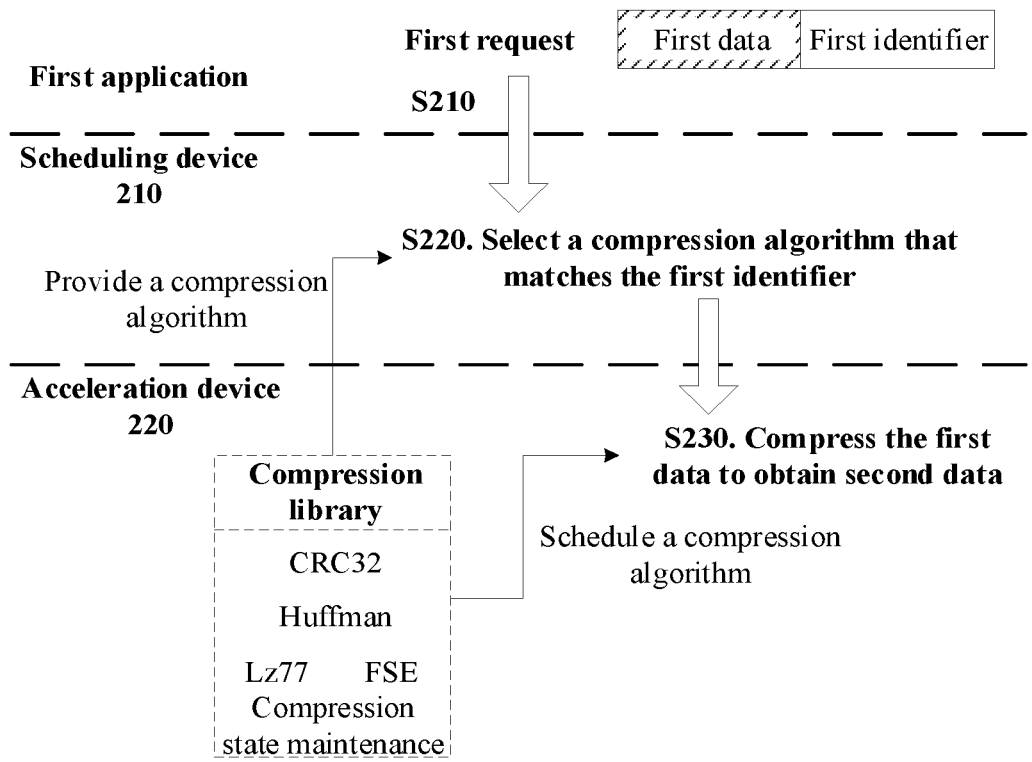
FIG. 2 is a schematic flowchart 1 of a data compression method according to this application.

Based on the compression system shown in FIG. 1, an embodiment provides a specific implementation of a data compression method below. FIG. 2 is a schematic flowchart 1 of a data compression method according to this application. A first application in FIG. 2 may implement a function of the application 1 or the application 2 in FIG. 1. A scheduling device 210 may include nodes or units in the scheduling device 110. An acceleration device 220 may implement data compression and decompression functions. For example, the acceleration device 220 may be the acceleration device 121 or the acceleration device 122 shown in FIG. 1.

As shown in FIG. 2, the data compression method provided in this embodiment includes the following steps S210 to S230.

S210: The scheduling device 210 obtains a first request.

The first request carries first data of a first application and a first identifier indicating a first lossless compression mode.

The first data is to-be-compressed data provided by the first application. For example, the first data is video or image data obtained in a running process of the first application. In another example, the first data is intermediate data generated in a data operation process of the first application.

In an optional example, the first identifier is set in a data header of the first request in a form of a string, and the first identifier directly indicates the first lossless compression mode. For example, the first lossless compression mode may be, but is not limited to zlib compression, Snappy compression, Zstd compression, or the like, and may further refer to Lz4 compression, Lempel-Ziv-Oberhumer (LZO) compression, or the like.

In another optional example, the first identifier is an interface address provided by a lossless compression software library selected by a user (a client, a host that operates the first application, or the like) in an application running process. Because standard interfaces provided by different lossless compression software libraries are different, the interface address indicates a type of the lossless compression mode.

S220: The scheduling device 210 selects, based on the first request, a compression algorithm that matches the first identifier from a compression library.

The compression library includes at least one compression algorithm supporting implementation of the first lossless compression mode. As shown in FIG. 1, these compression algorithms include but are not limited to a CRC32 algorithm, a Huffman coding algorithm, an Lz77 compression algorithm, an FSE compression algorithm, compression state maintenance, and the like.

In CRC, a number is generated with complicated calculation based on the transmitted data. The calculation is performed by a sending device before the data is transmitted. Then, the result is sent to a receiving device. After receiving the data, the receiving device repeats the same operation. If the operation results of the two devices are the same, it is considered that the data transmission is correct. This process is referred to as redundancy check. The CRC32 algorithm is to generate a 4-byte (32-bit) check value, and perform data check by using an 8-bit hexadecimal number, for example, EA 12 CD 45. The CRC algorithm has advantages of being simple and fast. In some examples, the CRC32 algorithm is referred to as a data check algorithm.

The Huffman coding algorithm is a lossless compression algorithm based on entropy coding. In computer data processing, the Huffman coding algorithm uses a variable-length encoding table to encode a source symbol (for example, a letter in a file), where the variable-length encoding table is obtained by using a method for evaluating a probability of occurrence of the source symbol. A letter with a high probability of occurrence is encoded by using a short code, and a letter with a low probability of occurrence is encoded by using a long code. This reduces an average length and an expected value of an encoded string, thereby achieving an objective of lossless data compression. For example, in English, "e" has the highest probability of occurrence, and "z" has the lowest probability of occurrence. When Huffman coding is used to compress an English text, "e" is likely to be represented by one bit, while "z" may be represented by 25 bits (not 26). In some possible cases, to implement data decoding, a Huffman decoding algorithm may be further deployed in the foregoing compression library.

The Lz77 compression algorithm is a dictionary-based lossless compression algorithm. Specifically, the Lz77 compression algorithm represents complex data in a data stream by using a simple code, and establishes a conversion table, also referred to as a "string table", for a correspondence between the code and the data. The conversion table is dynamically generated in a compression or decompression process. The conversion table is required only in the compression or decompression process. Once the compression or decompression ends, the table does not take effect.

Figure 3:
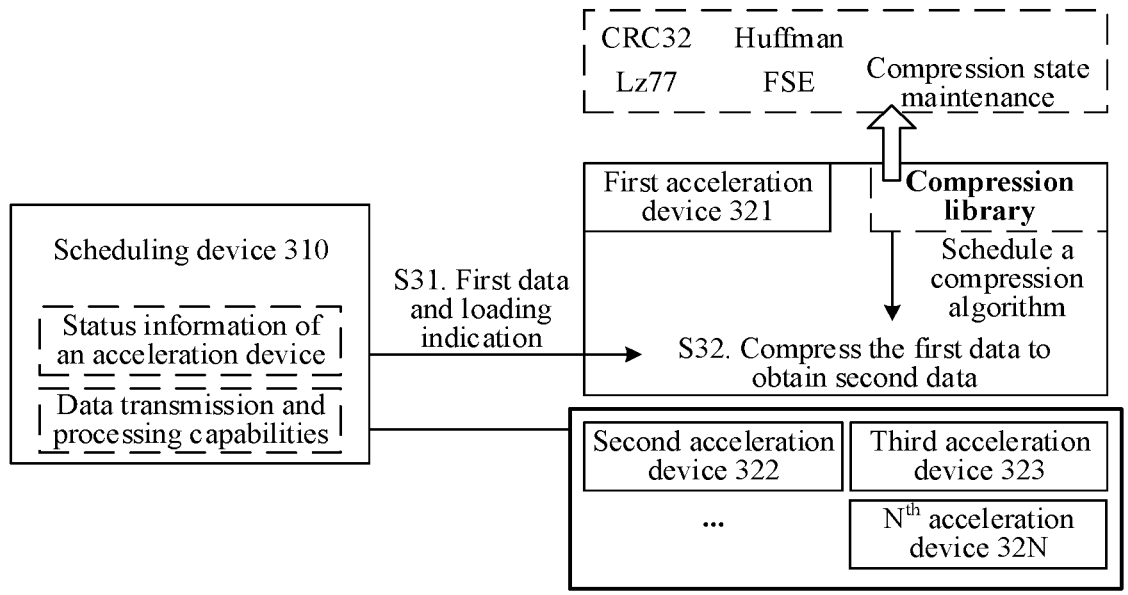
FIG. 3 is a schematic flowchart 2 of a data compression method according to this application.
Figure 4:
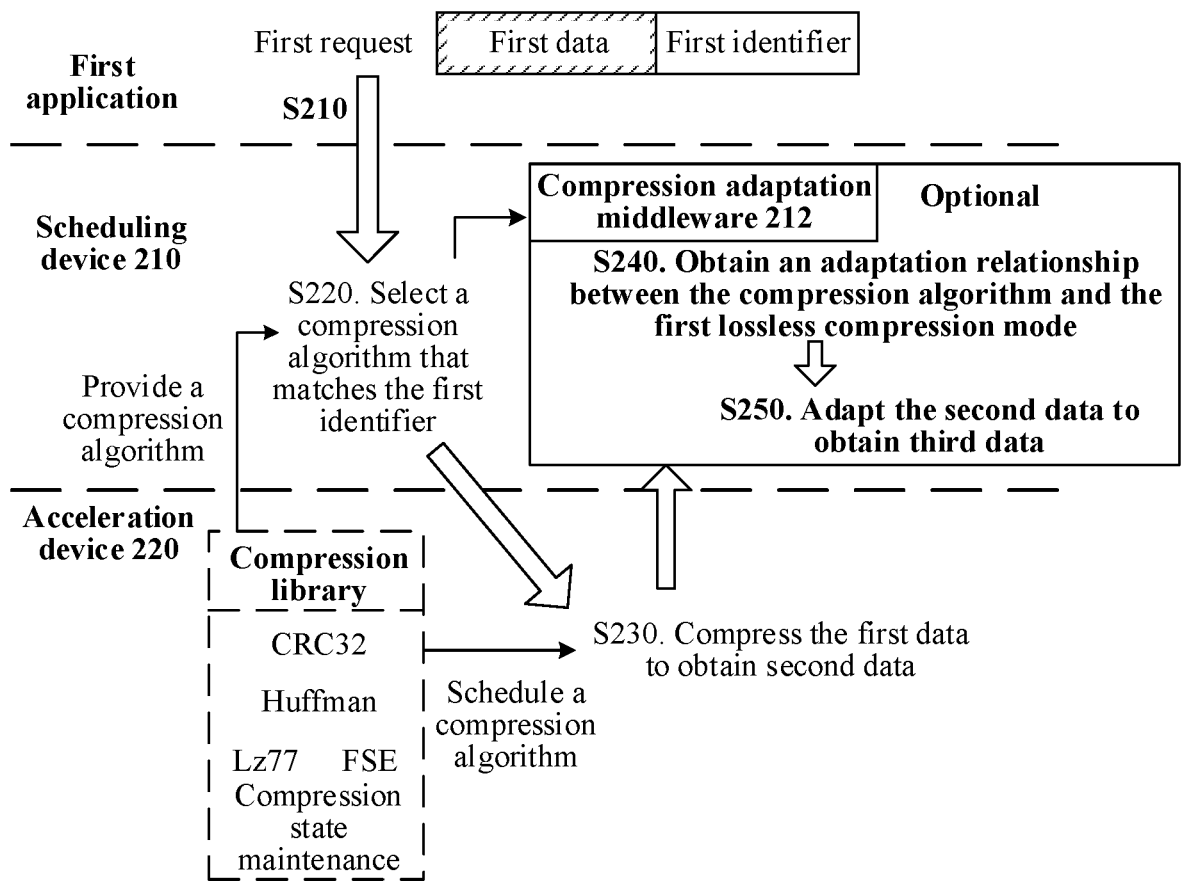
FIG. 4 is a schematic flowchart 3 of a data compression method according to this application.

The FSE compression algorithm is a lossless compression algorithm based on an asymmetric digital system (ANS). The FSE compression algorithm uses a table that uses an approximate probability to represent data and converts probability calculation in arithmetic coding to table lookup, which greatly improves the data compression efficiency. It should be noted that FIG. 2 to FIG. 4 are described by using an example in which the compression library includes the FSE. However, in some possible examples, to implement the Zstd compression mode, the FSE compression algorithm may alternatively be set in the scheduling device. This is not limited in this application.

Compression state maintenance refers to a method provided for maintaining an intermediate state of data stream compression in a compression process of a data stream, to avoid an error in data compression caused by a compression terminal. For example, for a data block (for example, block) of 16 kilobytes (KB), if compression matching information of the data block exists in a previous compression window (or operation) of a data stream, and an intermediate state of the previous compression window in this current data block is stored in an intermediate-state module, the compression system may reuse the compression matching information to compress the data block, thereby optimizing a data stream compression process and saving time required for data stream compression. In addition, because the compression system reuses historical compression matching information, when data blocks are in a same lossless compression mode, a hit rate of a compression process is improved, thereby improving a data compression rate.

Different types of lossless compression modes may be implemented by using different compression algorithms.

For example, the zlib compression mode may be implemented with support of an Lz77 compression algorithm and a Huffman coding algorithm.

In another example, the Zstd compression mode may be implemented with support of intermediate-state information of an Lz77 compression algorithm, an FSE compression algorithm, and compression state maintenance.

In another example, the Snappy compression mode may be implemented by using a hash matching algorithm, and the hash matching algorithm is essentially also an Lz77 compression algorithm. Therefore, the Snappy compression mode may alternatively be implemented by using the Lz77 algorithm.

It should be noted that the foregoing is only an example of compression algorithms included in several lossless compression modes provided in this embodiment, and other lossless compression modes may also include one or more of the foregoing lossless compression algorithms. Specific compression implementation of each type of lossless compression mode is determined by a requirement of the lossless compression mode.

In a possible case, the compression library is stored in a memory of an acceleration device.

In an example, a memory included in each acceleration device stores the foregoing compression library.

In another example, one or more acceleration devices of the compression system share one memory, and the memory stores the foregoing compression library.

Still referring to FIG. 2, the data compression method provided in this embodiment further includes the following step S230.

S230: The acceleration device 220 compresses the first data based on the compression algorithm that matches the first identifier, to obtain second data.

For example, the acceleration device 220 schedules, from the compression library stored locally (in a memory of the acceleration device 220), the compression algorithm corresponding to the first identifier, to compress the first data to obtain the second data.

In this embodiment, the lossless compression mode is split into one or more fine-grained compression algorithms, the memory of the acceleration device stores the compression library, and the compression library includes one or more compression algorithms that support implementation of a lossless compression mode. Therefore, when obtaining any compression request, the compression system may select, based on an identifier that is carried in the compression request and that indicates a lossless compression mode, a compression algorithm corresponding to the lossless compression mode, thereby performing compression processing on data in the specified lossless compression mode by using the compression algorithm corresponding to the identifier, to avoid a problem that one acceleration device can implement only one lossless compression mode in common technologies, and improve lossless compression adaptability of the acceleration device in the compression system.

Optionally, the compression system may perform compression processing on the first data in a manner shown in FIG. 3. FIG. 3 is a schematic flowchart 2 of a data compression method according to this application. A compression system shown in FIG. 3 includes one scheduling device 310 and at least one acceleration device, such as a first acceleration device 321, a second acceleration device 322, a third acceleration device 323, . . . , and an $N^{th}$ acceleration device 32N. The scheduling device 310 may implement a function of the foregoing scheduling device 110 or scheduling device 210. The acceleration device shown in FIG. 3 may be the acceleration device 121 or the acceleration device 122 shown in FIG. 1, or the acceleration device 220 shown in FIG. 2.

As shown in FIG. 3, S230 may include the following steps S31 and S32.

S31: The scheduling device 310 sends, to the first acceleration device 321 included in the at least one acceleration device, the first data and an indication for loading the compression algorithm that matches the first identifier to perform compression.

The first acceleration device 321 is an acceleration device that is in the plurality of acceleration devices shown in FIG. 3 and that supports implementation of the compression algorithm corresponding to the first identifier.

Optionally, the foregoing first acceleration device may be determined in the following manner: The scheduling device 310 obtains a status of each acceleration device of the at least one acceleration device included in the compression system; and then the scheduling device 310 selects, as the first acceleration device 321, an acceleration device in an idle state that is in the at least one acceleration device and that supports implementation of the compression algorithm that matches the first identifier.

As shown in FIG. 3, the scheduling device 310 may obtain status information of each acceleration device in the compression system. The status information indicates that a working status of the acceleration device is running, idle, abnormal, or the like. The status information may be stored in a memory of the scheduling device 310 in a form of a text or a chart. The following Table 1 shows status information of a plurality of acceleration devices shown in FIG. 3.

TABLE 1

| Acceleration device | Status |
| --- | --- |
| First acceleration device 321 | Idle |
| Second acceleration device 322 | Running |
| Third acceleration device 323 | Idle |
| . . . | . . . |
| Nth acceleration device 32N | Abnormal |

The first acceleration device 321 and the third acceleration device 323 are in an idle state, the second acceleration device 322 is in a running state, and the $N^{th}$ acceleration device 32N is in an abnormal working state.

The scheduling device 310 may further obtain data transmission and processing capabilities of an acceleration device in the compression system. The data transmission capability is a data transmission bandwidth that can be supported by the acceleration device, and the data processing capability may include an integer computing capability and a floating-point number computing capability that are of the acceleration device. In addition, the data processing capability may further indicate a type of a compression algorithm that can be scheduled by the acceleration device.

For example, if the first lossless compression mode is zlib compression, the compression algorithm determined by the scheduling device based on the first identifier includes the Huffman coding algorithm and the Lz77 compression algorithm. If the first acceleration device 321 shown in Table 1 supports the Huffman coding algorithm and the Lz77 compression algorithm, but the third acceleration device 323 supports only the Lz77 compression algorithm, the scheduling device considers that the first acceleration device 321 of the plurality of acceleration devices shown in Table 1 is in an idle state, and may also support implementation of a compression algorithm required for zlib compression. In this case, the scheduling device sends, to the first acceleration device, the first data and an indication for loading the Huffman coding algorithm and the Lz77 compression algorithm to perform data compression.

S32: The first acceleration device 321 compresses the first data by using the compression algorithm that matches the first identifier, to obtain the second data.

In this way, when the compression system includes a plurality of different acceleration devices, the scheduling device included in the compression system may select a matched acceleration device based on information such as working statuses and data transmission and processing capabilities of the different acceleration devices, and the selected acceleration device performs a data compression operation, to avoid a case that compression processing is performed on to-be-compressed data in the compression system by an acceleration device that runs another compression or decompression process, thereby reducing a waiting time required for data compression, and improving data compression efficiency of the compression system.

In addition, because the scheduling device included in the compression system may schedule an acceleration device based on information such as working statuses of a plurality of acceleration devices, when the compression system includes a plurality of acceleration devices, load balancing management of the plurality of acceleration devices in the compression system can be effectively implemented, thereby improving overall efficiency of performing data compression or decompression by the compression system.

In an optional implementation, because some compression algorithms are not greatly different, independent deployment of each compression algorithm of the compression algorithms in the compression library occupies large storage space. To improve universality of the compression algorithms, reduce compression algorithms stored in the compression library, and increase a quantity of lossless compression modes that can be supported by one acceleration device, a possible implementation is provided based on FIG. 2. As shown in FIG. 4, FIG. 4 is a schematic flowchart 3 of a data compression method according to this application. After the compression system obtains the second data, the data compression method provided in this embodiment further includes the following steps S240 and S250.

S240: The scheduling device 210 obtains, for each of compression algorithms that match the first identifier, an adaptation relationship between the compression algorithm and the first lossless compression mode.

For example, the adaptation relationship refers to a mapping relationship used to adapt a compression algorithm to different lossless compression modes (for example, in terms of a data format).

Optionally, the adaptation relationship is different from an algorithm adaptation patch of the lossless compression mode. The algorithm adaptation patch of the lossless compression mode refers to program code of a hardware acceleration device and a lossless compression software library that are developed by the compression device to implement the lossless compression mode. The adaptation relationship provided in this embodiment is data mapping between a compression algorithm (software) and a lossless compression mode software library (software).

In a first possible case, the adaptation relationship between the compression algorithm and the first lossless compression mode refers to a mapping relationship defined by a lossless compression software library that supports implementation of the first lossless compression mode. For example, if the compression algorithm included in the compression library in the acceleration device is the Lz77 compression algorithm, and the compression algorithm required by the lossless compression mode (for example, zlib compression) is also the Lz77 compression algorithm, the adaptation relationship between the Lz77 compression algorithm and the zlib compression is a mapping relationship defined by a standard zlib compression software library.

In a second possible case, the adaptation relationship between the compression algorithm and the first lossless compression mode refers to a mapping relationship of adapting an existing compression algorithm in the acceleration device to a compression algorithm required for implementing the first lossless compression mode when all compression algorithms for implementing the first lossless compression mode are not stored in the compression library of the acceleration device. For example, if the compression algorithm included in the compression library in the acceleration device is the Lz77 compression algorithm, and the compression algorithm required by the lossless compression mode (for example, Snappy compression) is also a hash matching algorithm, for example, the Lz77 compression algorithm, the hash matching algorithm may implement a similar compression function. The scheduling device included in the compression system may adapt the hash matching algorithm to the Lz77 compression algorithm, and a conversion relationship between the hash matching algorithm and the Lz77 compression algorithm is an adaptation relationship between the compression algorithm and the first lossless compression mode.

S250: The scheduling device 210 processes the second data based on the adaptation relationship corresponding to the compression algorithm that matches the first identifier, to obtain third data.

The third data satisfies a compression requirement of the first lossless compression mode.

Optionally, S250 specifically includes the following process: After determining the adaptation relationship corresponding to the compression algorithm that matches the first identifier, the scheduling device 210 obtains the second data obtained by compressing the first data by the first acceleration device, and performs conversion and adaptation on the second data by using the foregoing adaptation relationship, to obtain the third data.

When the compression library of the acceleration device does not include the compression algorithm required by the lossless compression mode, if the compression algorithm required by the lossless compression mode may be implemented by another compression algorithm in the compression library, the scheduling device included in the compression system may adapt the another compression algorithm to the lossless compression mode. Specifically, the scheduling device adapts the another compression algorithm to the compression algorithm required by the lossless compression mode, so that the scheduling device processes the compressed second data by using an adaptation relationship corresponding to the another compression algorithm, to obtain the third data.

In this way, in this embodiment, a compression algorithm included in a compression library of one acceleration device can support implementation of more lossless compression modes, thereby resolving a disadvantage that one acceleration device can implement only one lossless compression mode in common technologies, improving performance of implementing a lossless compression mode by the acceleration device, and optimizing efficiency of performing lossless compression by a compression system.

In the foregoing embodiment of this application, an example in which the compression system performs lossless compression on the data of the first application is used for description. In some possible cases, if the acceleration device has completed a requirement of the first lossless compression mode of the first application, the acceleration device may further complete a requirement of another lossless compression mode of the first application. For specific implementation, refer to related content in FIG. 2 to FIG. 4. Details are not described herein again.

In a first example, if the first acceleration device has completed data compression in the first lossless compression mode on the first data provided by the first application, the first acceleration device may further complete data compression, decompression, or the like in another lossless compression mode on other data provided by the first application.

In a second example, in a process in which the first acceleration device performs data compression on the first data provided by the first application, the compression system may further perform, by using another acceleration device, data compression on data provided by another application.

In a possible implementation, that the compression system performs, by using another acceleration device, data compression on data provided by another application may specifically include the following process.

First, the scheduling device may obtain a second request, where the second request carries fourth data of a second application and a second identifier indicating a second lossless compression mode. For example, the second application may be the application 2 shown in FIG. 1, and the second lossless compression mode refers to Snappy compression.

Then, the scheduling device selects, based on the second request, a compression algorithm that matches the second identifier from the compression library. For example, if the second lossless compression mode refers to Snappy compression, the compression algorithm that matches the second identifier refers to the Lz77 compression algorithm.

In addition, the scheduling device selects a second acceleration device that is in the compression system and that supports implementation of the compression algorithm that matches the second identifier. For example, the second acceleration device may be the acceleration device 122 shown in FIG. 1, or may be the second acceleration device 322 shown in FIG. 3 and Table 1.

Finally, the second acceleration device compresses the fourth data by using the compression algorithm that matches the second identifier, to obtain fifth data. For a process in which the second acceleration device compresses the fourth data to obtain the fifth data, refer to related descriptions in S230, FIG. 3, and FIG. 4. Details are not described herein again.

In this way, in this embodiment, data provided by different applications may be implemented by different acceleration devices in the compression system, to avoid data confusion caused by compressing the data provided by the different applications by one acceleration device and avoid an excessively long data processing time caused by excessively heavy data compression or decompression load of the one acceleration device, thereby reducing a total time consumed by the compression system to perform data compression or decompression on data provided by a plurality of applications, and improving data compression or decompression efficiency of the compression system.

Figure 5:
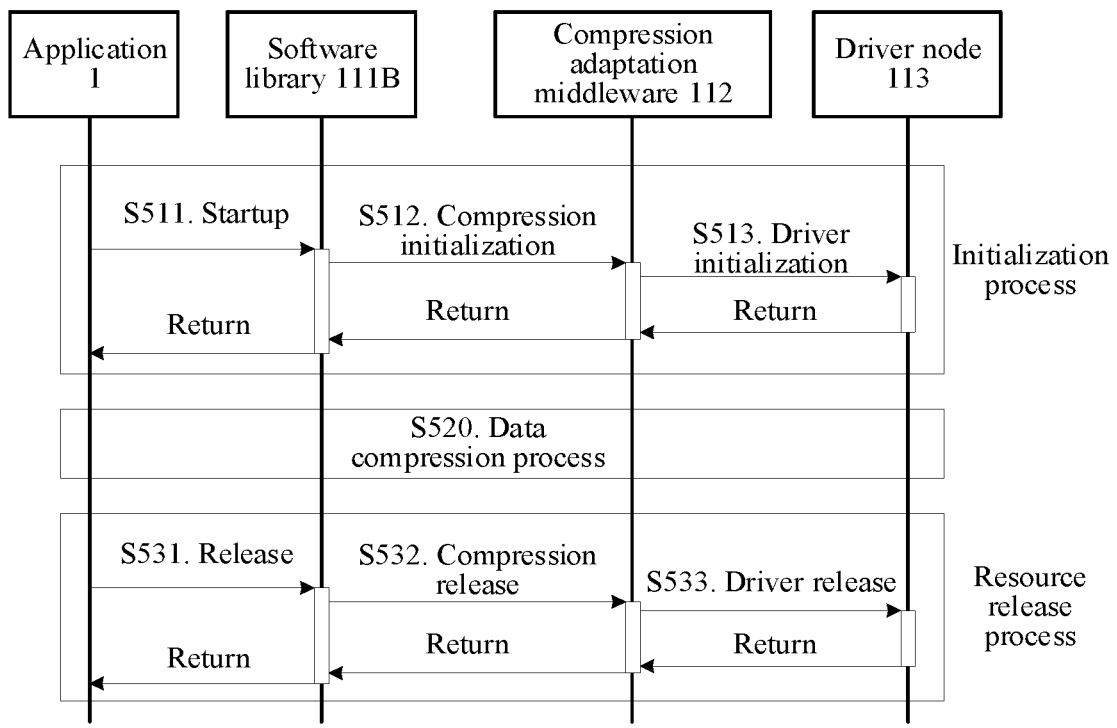
FIG. 5 is a schematic diagram of resource scheduling for data compression according to this application.

To prevent the compression system from being in another state and improve efficiency of performing data compression or decompression by the compression system, based on the data compression method provided in the foregoing embodiment, this application further provides a possible specific embodiment. As shown in FIG. 5, FIG. 5 is a schematic diagram of resource scheduling for data compression according to this application. For content of an application 1, a software library 111B, compression adaptation middleware 112, and a driver node 113, refer to related descriptions in FIG. 1. Details are not described herein again.

An example in which the software library 111B is a Zstd compression software library is used for description. As shown in FIG. 5, a resource scheduling process of data compression includes an initialization process, a data compression process, and a resource release process.

The initialization process includes: Upper-layer APP application software initiates compression, and invokes an interface of a standard Zstd compression software library to perform initialization and compression operations, as shown in S511 to S513 in FIG. 5.

S511: The application 1 initiates startup information of data compression.

The startup information indicates the software library 111B, the compression adaptation middleware 112, and the driver node 113 to prepare an available state of a compression system for a data compression process.

S512: The software library 111B and the compression adaptation middleware 112 collaborate to implement compression initialization.

For example, the compression initialization refers to updating an adaptation relationship between a compression algorithm and a lossless compression mode in the compression adaptation middleware 112 to a mapping relationship defined by a standard lossless compression mode. For example, the Zstd compression software library invokes an interface provided by the compression adaptation middleware in this application to perform initialization and Lz77, including initializing an intermediate-state adaptation module, a hardware acceleration device, and the like.

S513: The compression adaptation middleware 112 and the driver node 113 collaborate to implement driver initialization.

For example, the driver initialization refers to updating interfaces provided in the user mode and the kernel mode in the driver node 113 to an available state, to make it convenient to invoke the interface provided in the user mode or the kernel mode in a data compression process. For example, a driver interface of a lower-layer compression acceleration device is invoked through the compression adaptation middleware to implement hardware device initialization, then data that needs to be compressed is packaged, and the packaged data is delivered to the acceleration device through the driver interface.

After the application 1 determines, based on the information returned by the components, that the initialization process is completed, a data compression process is performed.

For a data compression process shown in step S520 in FIG. 5 and corresponding advantageous effects, refer to the content provided in FIG. 2 to FIG. 4. Details are not described herein again.

The resource release process includes: After the compression process ends, the upper-layer APP application software releases the interface provided by the standard Zstd compression software library, a driver of a scheduling device, and the like, as shown in S531 to S533 in FIG. 5.

S531: The application 1 releases the interface provided by the software library 111B.

For example, the application 1 is in a state of disconnecting from the interface provided by the software library 111B, so that the interface provided by the software library 111B is in a connectable state, to make it convenient for another application or process to use the interface.

S532: The software library 111B and the compression adaptation middleware 112 collaborate to implement a compression release process.

For example, the compression release process refers to updating an adaptation relationship between a compression algorithm and a lossless compression mode in the compression adaptation middleware 112 to an initial mapping relationship in the compression system.

S533: The compression adaptation middleware 112 and the driver node 113 collaborate to implement a driver release process.

For example, the driver release process refers to updating interfaces provided in the user mode and the kernel mode in the driver node 113 to an available state, to make it convenient to invoke the interface provided in the user mode or the kernel mode in a data compression process.

After the application 1 determines, based on the information returned by the components, that the resource release process is completed, the current round of data compression process ends.

That is to say, original data of the APP invokes the standard Zstd compression library. The Zstd compression library invokes the compression adaptation middleware in this embodiment, performs compression algorithm adaptation by using the middleware, and transmits the original data to the acceleration device through the interface provided in the user mode. For example, the Zstd library performs Lz77 compression this time, the compression adaptation middleware invokes an Lz77 adaptation module, and the Lz77 adaptation module invokes a corresponding driver interface to send related data and intermediate-state information to a corresponding hardware module (acceleration device) for calculation, and then a calculation result is returned to the Lz77 adaptation module of the middleware through the driver interface. Then, the compression adaptation middleware returns the calculation result to the Zstd library and modifies related status information of the Zstd library to complete one time of hardware acceleration operation. Finally, all Lz77 algorithms of Zstd are implemented by the hardware acceleration device.

In this way, in this embodiment, the driver node supports management of a plurality of compression cards. When the compression adaptation middleware invokes an initialization function to initialize hardware, a compression card (an acceleration device) is automatically allocated to the compression adaptation middleware. After compression is completed, a hardware resource release function interface is invoked, and the driver node performs an acceleration device recycling operation, thereby implementing load balancing of the plurality of acceleration devices, and improving overall efficiency of performing data compression or decompression by the compression system.

It may be understood that to implement functions in the foregoing embodiments, the scheduling device and the acceleration device include corresponding hardware structures and/or software modules for performing various functions. A person skilled in the art should be easily aware that, based on the units and the method steps in the examples described in embodiments disclosed in this application, this application can be implemented through hardware or a combination of hardware and computer software. Whether a function is executed through hardware or hardware driven by computer software depends on particular application scenarios and design constraint conditions of the technical solutions.

The foregoing describes in detail the data compression method according to this application with reference to FIG. 1 to FIG. 5. The following describes a data compression apparatus and a device according to this application with reference to FIG. 6 to FIG. 8.

Figure 6:
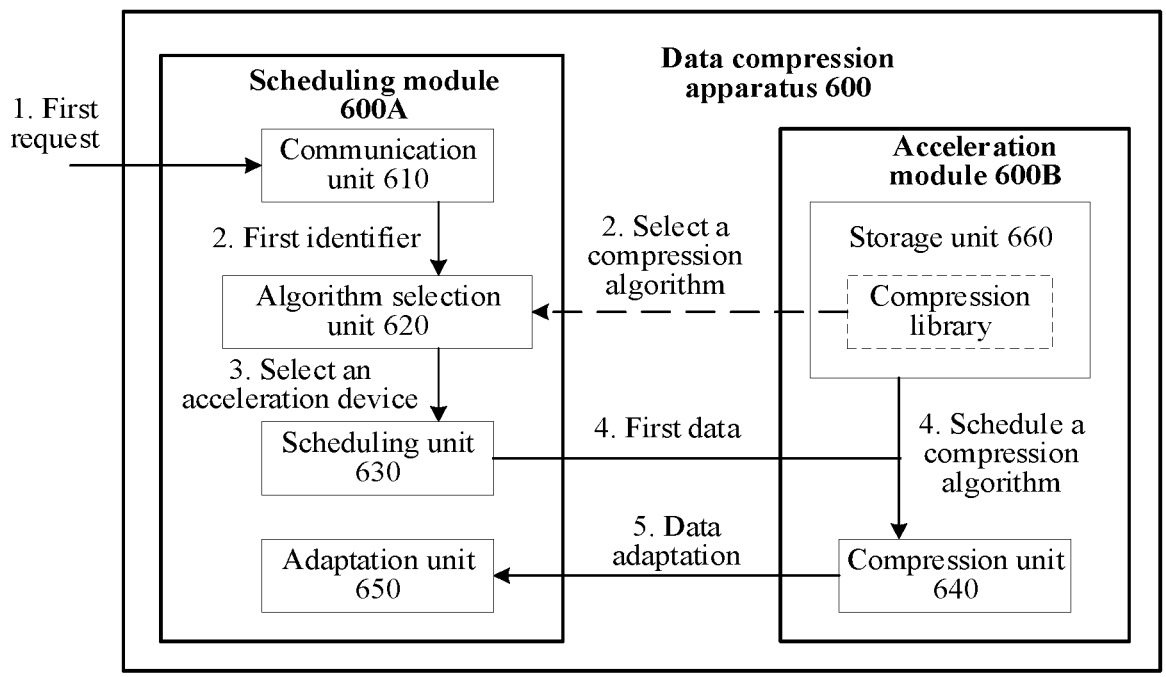
FIG. 6 is a schematic diagram of a structure of a data compression apparatus according to this application.

FIG. 6 is a schematic diagram of a structure of a data compression apparatus according to this application. The data compression apparatus 600 may be configured to implement a function of the scheduling device and the acceleration device in the foregoing method embodiments, and therefore can also achieve advantageous effects of the foregoing method embodiments. In this embodiment of this application, the data compression apparatus 600 may be the scheduling device 110 shown in FIG. 1 or any acceleration device, may be the scheduling device or the acceleration device shown in FIG. 2 to FIG. 5, or may be a module (for example, a chip) applied to the scheduling device or the acceleration device.

As shown in FIG. 6, the data compression apparatus 600 includes a communication unit 610, an algorithm selection unit 620, a scheduling unit 630, a compression unit 640, an adaptation unit 650, and a storage unit 660. The data compression apparatus 600 is configured to implement functions of the scheduling device and the acceleration device in the method embodiments shown in FIG. 2 to FIG. 5. In a possible example, a specific process in which the data compression apparatus 600 is configured to implement the foregoing data compression method includes the following content 1 to content 5.

1: The communication unit 610 is configured to obtain a first request that carries first data and a first identifier. The first identifier indicates a first lossless compression mode.
2: The algorithm selection unit 620 is configured to select, based on the first request, a compression algorithm that matches the first identifier from a compression library. The compression library is stored in the storage unit 660. For a compression algorithm stored in the compression library, refer to related content in S220. Details are not described herein again.
3: The scheduling unit 630 selects, based on information such as a status and data transmission and processing capabilities of each acceleration device in the compression system, an acceleration device that supports implementation of the first lossless compression mode.
4: The scheduling unit 630 sends the first data to the compression unit 640, and the compression unit 640 schedules the compression algorithm that matches the first identifier in the compression library to compress the first data, to obtain second data.
5: The adaptation unit 650 adapts the second data based on an adaptation relationship between the compression algorithm corresponding to the first identifier and the first lossless compression mode to obtain third data. The third data satisfies a compression requirement of the first lossless compression mode.

In this way, in this embodiment, the compression library includes one or more compression algorithms that support implementation of a lossless compression mode. The lossless compression mode is split into one or more fine-grained compression algorithms. Therefore, when obtaining any compression request, the data compression apparatus may select, based on an identifier that is carried in the compression request and that indicates a lossless compression mode, a compression algorithm corresponding to the lossless compression mode, thereby performing compression processing on data in the specified lossless compression mode by using the compression algorithm corresponding to the identifier, to avoid a problem that one acceleration device can implement only one lossless compression mode in common technologies, and improve lossless compression adaptability of the acceleration device in the compression system.

When the data compression apparatus 600 is configured to implement the method embodiment shown in FIG. 2, the communication unit 610 is configured to perform S210, the algorithm selection unit 620 is configured to perform S220, and the compression unit 640 is configured to perform S230.

When the data compression apparatus 600 is configured to implement the method embodiment shown in FIG. 3, the scheduling unit 630 is configured to perform S31, and the compression unit 640 is configured to perform S32. The scheduling unit 630 is further configured to select a first acceleration device included in the compression system.

When the data compression apparatus 600 is configured to implement the method embodiment shown in FIG. 4, the communication unit 610 is configured to perform S210, the algorithm selection unit 620 is configured to perform S220, and the compression unit 640 is configured to perform S230, and the adaptation unit 650 is configured to perform S240 and S250.

In addition, in the foregoing example, the data compression apparatus 600 may implement functions of both the scheduling device and the acceleration device in the foregoing embodiments. However, in some possible examples, the data compression apparatus 600 may be divided into a scheduling module 600A and an acceleration module 600B. The scheduling module 600A and the acceleration module 600B are different software modules.

In a possible implementation, this application further provides a scheduling module 600A. The scheduling module 600A may implement functions of the scheduling device in the foregoing embodiments. For example, the scheduling module 600A includes a communication unit 610, an algorithm selection unit 620, a scheduling unit 630, and an adaptation unit 650. The scheduling module 600A may implement functions of the plurality of units.

In a possible implementation, this application further provides an acceleration module 600B. The acceleration module 600B may implement functions of the acceleration device in the foregoing embodiments. For example, the acceleration module 600B includes a compression unit 640 and a storage unit 660. The acceleration module 600B may implement functions of the plurality of units.

That is to say, in a specific implementation process of the data compression apparatus 600, a scheduling function and a compression acceleration function in a data compression process may be performed by using different software modules, and the scheduling module 600A and the acceleration module 600B may be implemented by different physical devices. Optionally, the scheduling module 600A and the acceleration module 600B may alternatively be implemented by a same physical device.

It should be understood that the data compression apparatus 600 in this embodiment of this application of the present disclosure may be implemented by using a CPU, or may be implemented by using an ASIC, or may be implemented by using a programmable logic device (PLD). The PLD may be a complex programmable logic device (CPLD), an FPGA, a generic array logic (GAL), or any combination thereof. When the data compression apparatus 600 implements, by using software, the data compression method shown in any one of FIG. 2 to FIG. 5, the data compression apparatus 600 and modules thereof may alternatively be software modules.

For more detailed descriptions of the data compression apparatus 600, directly refer to related descriptions in the embodiments shown in FIG. 2 to FIG. 5. Details are not described herein again.

Figure 7:
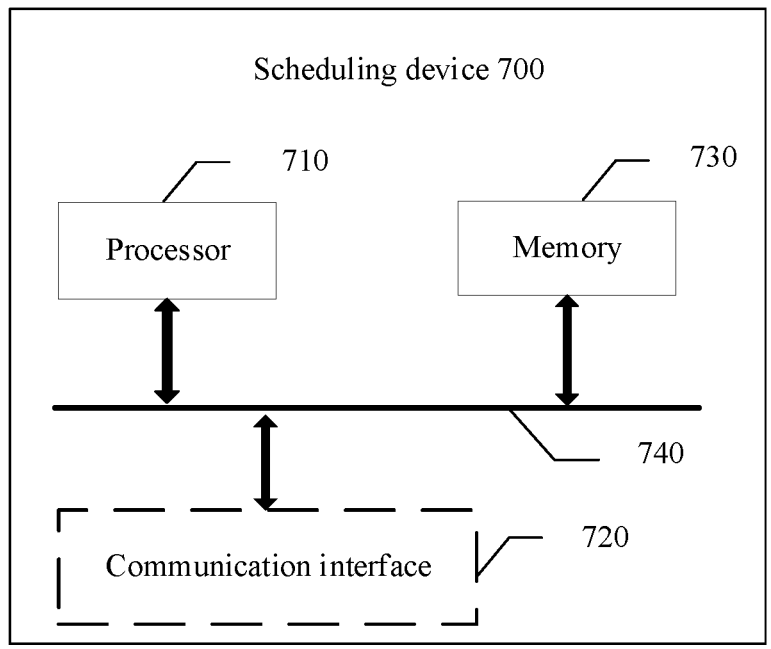
FIG. 7 is a schematic diagram of a structure of a scheduling device according to this application.

FIG. 7 is a schematic diagram of a structure of a scheduling device according to this application. The scheduling device 700 includes a processor 710 and a communication interface 720. The processor 710 and the communication interface 720 are coupled to each other. It may be understood that the communication interface 720 may be a transceiver or an input/output interface. Optionally, the scheduling device 700 may further include a memory 730, configured to store an instruction executed by the processor 710, or store input data required by the processor 710 to run an instruction, or store data generated after the processor 710 runs an instruction.

When the scheduling device 700 is configured to implement the methods shown in FIG. 2 to FIG. 5, the processor 710 and the communication interface 720 are configured to perform functions of the foregoing scheduling device. The processor 710, the communication interface 720, and the memory 730 may further collaborate to implement the operation steps in the data compression method performed by the scheduling device. The scheduling device 700 may further perform a function of the data compression apparatus 600 shown in FIG. 6, and details are not described herein again.

A specific connection medium between the communication interface 720, the processor 710, and the memory 730 are not limited in this embodiment of this application. In this embodiment of this application, the communication interface 720, the processor 710, and the memory 730 are connected by using a bus 740 in FIG. 7. The bus is represented by using a thick line in FIG. 7, and a connection manner between other components is merely described as an example, and is not limited thereto. The bus may be divided into an address bus, a data bus, a control bus, and the like. For ease of description, the bus in FIG. 7 is represented by using only one bold line, but which does not indicate that there is only one bus or one type of bus.

The memory 730 may be configured to store a software program and a module, for example, a program instruction/module corresponding to the data compression method provided in embodiments of this application. The processor 710 executes the software program and the module stored in the memory 730, to implement various functional applications and data processing. The communication interface 720 may be configured to perform signaling or data communication with another device. In this application, the scheduling device 700 may have a plurality of communication interfaces 720.

It should be understood that the scheduling device 700 according to this embodiment of this application of the present disclosure may correspond to the data compression apparatus 600 in embodiments of this application of the present disclosure, and may correspond to an entity in FIG. 2 for performing the method in embodiments of this application of the present disclosure, and the foregoing and other operations and/or functions of each unit in the scheduling device 700 are respectively for implementing corresponding procedures of the methods in FIG. 2 to FIG. 5. For brevity, details are not described herein again.

Figure 8:
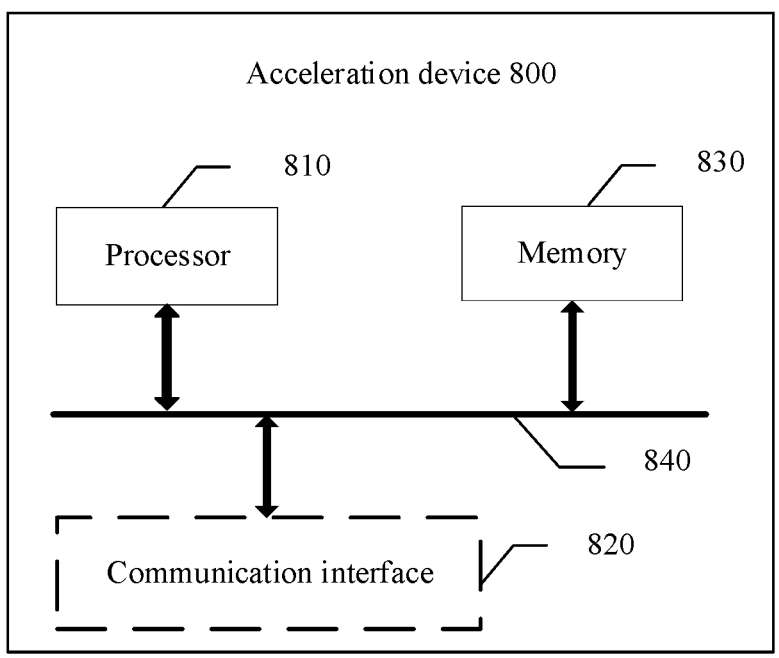
FIG. 8 is a schematic diagram of a structure of an acceleration device according to this application.

This application further provides an acceleration device. FIG. 8 is a schematic diagram of a structure of an acceleration device according to this application. The acceleration device 800 includes a processor 810 and a communication interface 820. The processor 810 and the communication interface 820 are coupled to each other. It may be understood that the communication interface 820 may be a transceiver or an input/output interface. Optionally, the acceleration device 800 may further include a memory 830, configured to store an instruction executed by the processor 810, or store input data required by the processor 810 to run an instruction, or store data generated after the processor 810 runs an instruction. In this embodiment, the communication interface 820, the processor 810, and the memory 830 are connected by using a bus 840 in FIG. 8. The bus is represented by using a thick line in FIG. 8, and a connection manner between other components is merely described as an example, and is not limited thereto. The bus may be divided into an address bus, a data bus, a control bus, and the like. For ease of description, the bus in FIG. 8 is represented by using only one bold line, but which does not indicate that there is only one bus or one type of bus.

For more detailed content of the processor 810, the communication interface 820, the memory 830, and the bus 840 in the acceleration device 800, refer to related descriptions in FIG. 7. Details are not described herein again.

It may be understood that the processor in embodiments of this application may be a CPU, an NPU, or a GPU, or may be another general-purpose processor, a DSP, an ASIC, an FPGA or another programmable logic device, a transistor logic device, a hardware component, or any combination thereof. The general-purpose processor may be a microprocessor or any regular processor.

The method steps in embodiments of this application may be implemented in a hardware manner or may be implemented in a manner of executing a software instruction by a processor. The software instructions may include a corresponding software module. The software module may be stored in a random-access memory (RAM), a flash memory, a read-only memory (ROM), a programmable read-only memory (PROM), an erasable programmable read-only memory (EPROM), an electrically erasable programmable read-only memory (EEPROM), a register, a hard disk, a removable hard disk, a compact disc read-only memory (CD-ROM), or any other form of storage medium well-known in the art. For example, a storage medium is coupled to a processor, so that the processor can read information from the storage medium and write information into the storage medium. Certainly, the storage medium may alternatively be a component of the processor. The processor and the storage medium may be located in an ASIC. In addition, the ASIC may be located in a network device or a terminal device. Certainly, the processor and the storage medium may exist in the network device or the terminal device as discrete components.

This application further provides a data compression system. The system includes a scheduling device and an acceleration device shown in FIG. 1. Specific structures of the scheduling device and the acceleration device are shown in FIG. 7 and FIG. 8, to implement functions of operation steps performed by corresponding bodies in any method in FIG. 2 to FIG. 5. For brevity, details are not described herein again.

One or more of the foregoing modules or units may be implemented by using software, hardware, or a combination thereof. When any one of the foregoing modules or units is implemented by using software, the software exists in a form of a computer program instruction, and is stored in the memory. The processor may be configured to execute the program instruction to implement the foregoing method procedures. The processor may include but is not limited to at least one of the following: a CPU, a microprocessor, a DSP, a microcontroller unit (MCU), an AI processor, or other computing devices that run software. Each computing device may include one or more cores configured to execute a software instruction to perform an operation or processing. The processor may be built in an SoC or an ASIC, or may be an independent semiconductor chip. In addition to the cores configured to execute a software instruction to perform an operation or processing, the processor may further include a necessary hardware accelerator, such as an FPGA, a PLD, or a logic circuit that implements a dedicated logical operation.

When the foregoing modules or units are implemented by hardware, the hardware may be any one or any combination of a CPU, a microprocessor, a DSP, an MCU, an AI processor, an ASIC, a SoC, an FPGA, a PLD, a dedicated digital circuit, a hardware accelerator, or a non-integrated discrete device, and the hardware may perform the foregoing method procedures by running necessary software or without depending on software.

All or some of the foregoing embodiments may be implemented by using software, hardware, firmware, or any combination thereof. When software is used to implement the embodiments, all or some of the foregoing embodiments may be implemented in a form of a computer program product. The computer program product includes one or more computer instructions. When the program instruction of the computer is loaded or executed on the computer, all or some of the steps are generated according to the process or function described in embodiments of this application of the present disclosure. The computer may be a general-purpose computer, a dedicated computer, a computer network, or other programmable apparatuses. The computer instructions may be stored in a computer-readable storage medium, or may be transmitted from a computer-readable storage medium to another computer-readable storage medium. For example, the computer instructions may be transmitted from a website, a computer, a server, or a data center to another website, computer, server, or data center in a wired or wireless manner. The wired may be a coaxial cable, an optical fiber, a digital subscriber line (DSL), or the like, and the wireless may be infrared, radio, microwave, or the like. The computer-readable storage medium may be any usable medium accessible to a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD)), a semiconductor medium, or the like. The semiconductor medium may be a solid-state drive (SSD).

The foregoing descriptions are merely specific implementations of this application. Any variation or replacement figured out by a person skilled in the art based on the specific implementations provided in this application shall fall within the protection scope of this application.

What is claimed is:

1. A method, comprising:
obtaining a first request carrying first data of a first application and carrying a first identifier indicating a first lossless compression mode;
selecting, based on the first request and from a compression library, a first compression algorithm that matches the first identifier, wherein the compression library comprises at least one compression algorithm supporting implementation of the first lossless compression mode, and wherein the compression library is stored in a memory of at least one acceleration device; and
performing compression processing on the first data based on the first compression algorithm in order to obtain second data.

2. The method of claim 1, wherein the at least one compression algorithm comprises at least one of an Lz77 compression algorithm, a Huffman coding algorithm, a cyclic redundancy check (CRC) algorithm, a finite state entropy (FSE) algorithm, or compression state maintenance.

3. The method of claim 1, further comprising:
obtaining an adaptation relationship between the first compression algorithm and the first lossless compression mode; and
processing the second data based on the adaptation relationship in order to obtain third data, wherein the third data satisfies a compression requirement of the first lossless compression mode.

4. The method of claim 3, wherein the at least one acceleration device comprises a first acceleration device, and wherein performing compression processing on the first data in order to obtain the second data comprises:
sending, to the first acceleration device, the first data and an indication for loading the first compression algorithm to perform compression; and compressing, by the first acceleration device, the first data using the first compression algorithm in order to obtain the second data.

5. The method of claim 4, wherein before sending the first data and the indication for loading the first compression algorithm to perform compression, the method further comprises:
obtaining a status of each acceleration device of the at least one acceleration device; and
selecting, as the first acceleration device, an acceleration device of the at least one acceleration device that is in an idle state and that supports implementation of the first compression algorithm.

6. The method of claim 4, further comprising:
obtaining a second request, wherein the second request carries fourth data of a second application and carries a second identifier indicating a second lossless compression mode;
selecting, based on the second request and from the compression library, a second compression algorithm that matches the second identifier;
selecting a second acceleration device that supports implementation of the second compression algorithm; and
compressing, by the second acceleration device, the fourth data using the second compression algorithm in order to obtain fifth data.

7. The method of claim 3, wherein the acceleration device is an accelerator card.

8. The method of claim 3, wherein the acceleration device is a virtual accelerator card.

9. The method of claim 1, wherein the first lossless compression mode is zlib compression, Snappy compression, or Zstd compression.

10. A compression system comprising:
at least one acceleration device comprising a first processor and a first memory, wherein the at least one acceleration device is configured to store a compression library; and
a scheduling device comprising a second processor and a second memory, wherein the scheduling device is configured to:
obtain a first request carrying first data of a first application and carrying a first identifier indicating a first lossless compression mode; and
select, based on the first request and from the compression library, a first compression algorithm that matches the first identifier, wherein the compression library comprises at least one compression algorithm supporting implementation of the first lossless compression mode, and
wherein the at least one acceleration device is configured to perform compression processing on the first data based on the first compression algorithm in order to obtain second data.

11. The compression system of claim 10, wherein the scheduling device is further configured to:
obtain an adaptation relationship between the first compression algorithm and the first lossless compression mode; and
process the second data based on the adaptation relationship in order to obtain third data, wherein the third data satisfies a compression requirement of the first lossless compression mode.

12. The compression system of claim 11, wherein the at least one acceleration device comprises a first acceleration device, and wherein the compression system is configured to perform compression processing on the first data in order to obtain the second data by:
sending, by the scheduling device to the first acceleration device, the first data and an indication for loading the first compression algorithm to perform compression; and
compressing, by the first acceleration device, the first data using the first compression algorithm in order to obtain the second data.

13. The compression system of claim 12, wherein before sending the first data and the indication for loading the first compression algorithm to perform compression, the scheduling device is configured to:
obtain a status of each acceleration device of the at least one acceleration device; and
select an acceleration device of the at least one acceleration device that is in an idle state that supports implementation of the first compression algorithm.

14. The compression system of claim 12, wherein the scheduling device is further configured to:
obtain a second request, wherein the second request carries fourth data of a second application and carries a second identifier indicating a second lossless compression mode;
select, based on the second request and from the compression library, a second compression algorithm that matches the second identifier; and
select a second acceleration device of the compression system, wherein the second acceleration device supports implementation of the second compression algorithm, and
wherein the second acceleration device is configured to compress the fourth data using the second compression algorithm in order to obtain fifth data.

15. The compression system of claim 10, wherein the at least one compression algorithm comprises at least one of an Lz77 compression algorithm, a Huffman coding algorithm, a cyclic redundancy check (CRC) algorithm, a finite state entropy (FSE) algorithm, or compression state maintenance.

16. The compression system of claim 10, wherein the first lossless compression mode is zlib compression, Snappy compression, or Zstd compression.

17. A computer program product comprising instructions that are stored on a non-transitory computer-readable medium and that, when executed by a processor, cause a compression system to:
obtain a first request, wherein the first request carries first data of a first application and a first identifier indicating a first lossless compression mode;
select, based on the first request and from a compression library, a first compression algorithm that matches the first identifier, wherein the compression library comprises at least one compression algorithm supporting implementation of the first lossless compression mode; and
perform compression processing on the first data based on the first compression algorithm in order to obtain second data.

18. The computer program product of claim 17, wherein the at least one compression algorithm comprises at least one of an Lz77 compression algorithm, a Huffman coding algorithm, a cyclic redundancy check (CRC) algorithm, a finite state entropy (FSE) algorithm, or compression state maintenance.

19. The computer program product of claim 17, wherein the first lossless compression mode is zlib compression, Snappy compression, or Zstd compression.

20. The computer program product of claim 17, wherein the instructions, when executed by the processor, further cause the compression system to:
  obtain an adaptation relationship between the first compression algorithm and the first lossless compression mode; and
  process the second data based on the adaptation relationship in order to obtain third data, wherein the third data satisfies a compression requirement of the first lossless compression mode.

\* \* \* \* \*